(12) United States Patent
Kimura (10) Patent No.: US 12,510,567 B2
(45) Date of Patent: Dec. 30, 2025

(54) CURRENT SENSE AMPLIFIER

(71) Applicant: WILL SEMICONDUCTOR (SHANGHAI) CO. LTD., Shanghai (CN)

(72) Inventor: Hiroyuki Kimura, Miyagi (JP)

(73) Assignee: WILL SEMICONDUCTOR (SHANGHAI) CO. LTD., Shanghai (CN)

( * ) Notice: Subject to any disclaimer, the term of this patent is extended or adjusted under 35 U.S.C. 154(b) by 142 days.

(21) Appl. No.: 18/543,572

(22) Filed: Dec. 18, 2023

(65) Prior Publication Data

US 2025/0088159 A1 Mar. 13, 2025

(30) Foreign Application Priority Data

Sep. 13, 2023 (JP) ................................ 2023-148102

(51) Int. Cl.
*G01R 19/00* (2006.01)
*H03F 1/30* (2006.01)
(Continued)

(52) U.S. Cl.
CPC ........... *G01R 19/0092* (2013.01); *H03F 1/30* (2013.01); *H03F 3/45076* (2013.01);
(Continued)

(58) Field of Classification Search
CPC . H03F 3/45076; H03F 3/45479–45995; H03F 3/68; H03F 2200/211; H03F 2200/447; G01R 19/0092
(Continued)

(56) References Cited

U.S. PATENT DOCUMENTS

| | | | |
|---|---|---|---|
| 7,183,756 B1 * | 2/2007 | Dikken | G01R 19/0092 323/280 |
| 2003/0001674 A1 * | 1/2003 | Nagaraj | H03F 3/45704 330/258 |

(Continued)

FOREIGN PATENT DOCUMENTS

JP H7-113826 5/1995

OTHER PUBLICATIONS

Texas instruments, Programmable-Gain, Voltage-Output, Bidirectional, Zero-Drift Series, Current-Shunt Monitor, www.ti.com, Feb. 2014, 33 pages.

(Continued)

*Primary Examiner* — Steven L Yeninas
(74) *Attorney, Agent, or Firm* — MUNCY, GEISSLER, OLDS & LOWE, P.C.

(57) ABSTRACT

A current sense amplifier measures a voltage drop in a drive transistor LS to measure the current flowing through the drive transistor LS. The current sense amplifier includes a preamplifier pre-amp, to which a voltage across the drive transistor LS is inputted, and which obtains a positive output and a negative output corresponding to a voltage difference of the inputted voltage across the drive transistor; and a switch sw, which connects the input end of a common mode voltage vcm and the negative output, the common mode voltage vcm serving as the operation reference of the preamplifier pre-amp. A change of the positive output caused by turning on/off the switch sw can be detected.

4 Claims, 5 Drawing Sheets

(51) Int. Cl.
*H03F 3/45* (2006.01)
*H03F 3/68* (2006.01)

(52) U.S. Cl.
CPC ........... *H03F 3/45479* (2013.01); *H03F 3/68* (2013.01); *H03F 2200/211* (2013.01); *H03F 2200/447* (2013.01)

(58) Field of Classification Search
USPC .......................................................... 330/258
See application file for complete search history.

(56) References Cited

U.S. PATENT DOCUMENTS

| | | | | |
|---|---|---|---|---|
| 2009/0108929 | A1* | 4/2009 | Yan ..................... | H03F 3/45475 348/222.1 |
| 2014/0070971 | A1* | 3/2014 | Zabroda ............... | G11C 27/026 341/122 |
| 2014/0347119 | A1* | 11/2014 | Vacca Cavalotto ......................... | G01R 19/0092 327/434 |
| 2015/0332630 | A1* | 11/2015 | Chang .................. | G09G 3/3241 345/215 |
| 2017/0331432 | A1* | 11/2017 | Zhang ..................... | H03F 3/005 |
| 2019/0346528 | A1* | 11/2019 | Dang .................. | G01R 19/252 |
| 2021/0013834 | A1* | 1/2021 | Wang .................. | H03F 3/45654 |
| 2022/0091164 | A1* | 3/2022 | Guedon .................. | H02J 50/12 |

OTHER PUBLICATIONS

MPS, 35V, 3A, Three-Phase Power Stage, www.MonolithicPower. com, 2018, 14 pages.

\* cited by examiner

CURRENT SENSE AMPLIFIER

BACKGROUND OF THE INVENTION

1. Field of the Invention

The disclosure relates to a current sense amplifier for detecting the current flowing through a drive transistor.

2. Description of the Related Art

In a drive circuit for driving a load of a motor or the like, a drive transistor controlling a drive current is used. In addition, in order to control the drive current, it is necessary to detect the current flowing through the drive transistor, and a current sense amplifier is used to detect the current flowing through the drive transistor. In order to achieve good motor control, the current sense amplifier requires high speed, high precision, and low-temperature drift.

In addition, it is desirable that the current sense amplifier operates with low power consumption. Therefore, a configuration in which a current detection resistor is connected in series to the drive transistor is not preferable. It is desirable to detect the current by a voltage drop generated by an ON resistance (Rdson) of a power metal-oxide-semiconductor field-effect transistor (MOSFET), which is used as the drive transistor.

However, because the ON resistance Rdson changes nonlinearly according to the current flow and temperature, it is difficult to detect the current with high precision by using the ON resistance.

In particular, offset trimming in the current sense amplifier is extremely important in compensating for the temperature dependence. The reason is that if the offset trimming is not performed accurately, a temperature drift at a current of 0 A will be caused, which is difficult to calibrate by the subsequent user application.

PRIOR ART DOCUMENTS

Patent Documents

[Patent document 1] Japanese Patent Laid-Open No. 7-113826

SUMMARY OF THE INVENTION

When the offset trimming is performed correctly and the input offset is zero, the bias current of the input flows in a well-balanced manner, and therefore the output current from the input stage will not flow to a current-voltage converter of the subsequent circuit. On the other hand, when there is an offset, the error current remaining after the center voltage is adjusted to a target value may cause a temperature drift.

A current sense amplifier related to the disclosure measures a voltage drop in a drive transistor to measure the current flowing through the drive transistor, and the current sense amplifier includes: a preamplifier, to which a voltage across the drive transistor is inputted, and which obtains a positive output and a negative output corresponding to a voltage difference of the inputted voltage across the drive transistor; and a switch, which connects the input end of a common mode voltage and the negative output, the common mode voltage serving as the operation reference of the preamplifier; where a change of the positive output and the negative output caused by turning on/off the switch is able to be detected.

In addition, the current sense amplifier related to the disclosure may further include a post-amplifier, to which the positive output and the negative output of the preamplifier are inputted, and which obtains an output corresponding to a difference of the input voltage, where a change of the positive output and the negative output caused by turning on/off the switch is able to be detected as a change of the output of the post-amplifier.

An offset of the preamplifier can be detected by the change of the output when the switch is turned on/off. Therefore, the offset voltage can be reduced by performing trimming adjustment about the preamplifier. Therefore, the temperature dependence of the current sense amplifier can be reduced.

PREFERRED EMBODIMENT OF THE PRESENT INVENTION

Hereinafter, embodiments of the disclosure are described with reference to the drawings. Note that, the following embodiments do not limit the scope of the disclosure, and configurations obtained by selectively combining multiple examples are also included in the disclosure.

"Overall Configuration"

Figure 1:
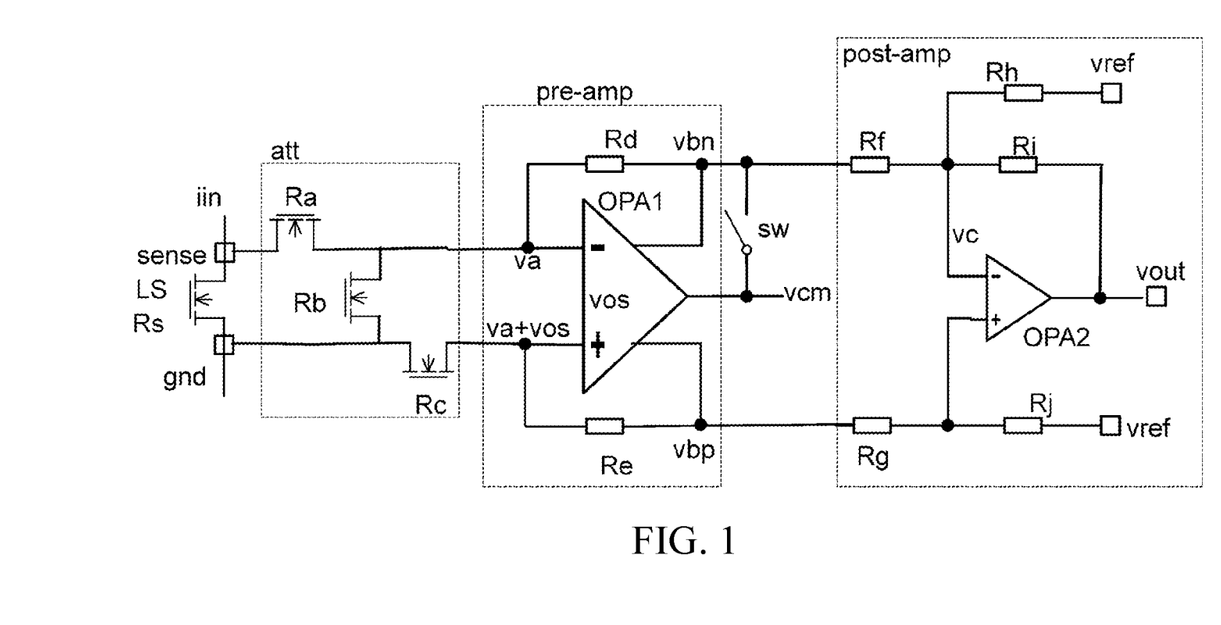
FIG. 1 is a circuit diagram showing the configuration of a current sense amplifier according to an embodiment.

FIG. 1 is a circuit diagram showing the configuration of a current sense amplifier according to an embodiment.

A drive transistor LS is a transistor for supplying a drive current to a load. In this example, the drive transistor LS is configured by an n-channel metal-oxide-semiconductor field-effect transistor (MOSFET), the drain of the drive transistor LS is connected to the load, and the source of the drive transistor LS is connected to a ground gnd. Here, the current flowing through the drive transistor LS is represented by "iin", and the ON resistance is represented by "Rs".

A current sense amplifier according to the embodiment detects the drive current flowing through the drive transistor LS according to a voltage drop (voltage across the drive transistor LS) when the drive transistor LS is turned on.

The drain of the drive transistor LS serves as a sense end sense, and the source of the drive transistor LS serves as a ground end gnd.

The sense end sense and the ground end gnd respectively corresponding to the drain and the source of the drive transistor LS are inputted to an attenuator att. The attenuator att includes three resistors Ra, Rb, and Rc. One end of the resistor Ra is connected to the sense end sense, and one end of the resistor Rc is connected to the ground end gnd. And, the other end of the resistor Ra and the ground end gnd are connected by the resistor Rb. The other end of the resistor Ra and the other end of the resistor Rc become a pair of output ends of the attenuator att. The resistors Ra, Rb, and Rc are configured by transistors having approximately the same temperature characteristic as the drive transistor LS, and a control signal similar to that of the gate of the drive transistor LS is supplied to the gate of each transistor.

In this way, by using the same type of transistor as the drive transistor LS as the element of the attenuator att, the current passing through the attenuator att becomes a value obtained by superposing a component proportional to the current flowing through the drive transistor LS and the feedback current flowing through resistors Rd and Re in a preamplifier pre-amp. Moreover, the displacement of the current passing through the attenuator att is proportional to the current flowing through the drive transistor LS. This is because the direct current (DC) component flowing through the resistors Rd and Re is determined by a common mode voltage vcm, and the change amount is equivalent to the current that is generated in the attenuator att and proportional to the LS current.

A pair of outputs from the attenuator att are inputted to the preamplifier pre-amp. The output end from the resistor Ra is connected to the negative input end of a first operational amplifier OPA1, and the output end from the resistor Rc is connected to the positive input end of the first operational amplifier OPA1. A positive output of the first operational amplifier OPA1 (negative output for the current iin) is connected to the negative input end via the feedback resistor Rd. In addition, a negative output of the first operational amplifier OPA1 (positive output for the current iin) is connected to the positive input end via the feedback resistor Re. In addition, the common mode voltage vcm is supplied to the common mode voltage input end of the first operational amplifier OPA1.

The operational amplifier OPA1 amplifies a pair of inputs (input voltages) according to the resistance values of the feedback resistors Rd and Re, using the common mode voltage vcm as the operation reference voltage (average voltage of positive and negative outputs), and outputs the amplified voltages. The voltages of the pair of outputs are voltages vbn and vbp, and the common mode voltage vcm=(vbn+vbp)/2.

And, the input end of the common mode voltage and the negative input end are connected by a switch sw. That is, the positive output end is fixed to vcm by turning on the switch sw.

The preamplifier pre-amp obtains an output of a voltage difference corresponding to a voltage drop of the drive transistor LS between the negative output end and the positive output end thereof.

The negative output end and the positive output end of the preamplifier pre-amp are inputted to the post-amplifier post-amp. The negative output end of the preamplifier pre-amp is connected to the negative input end of a second operational amplifier OPA2 via a resistor Rf. In addition, the output end of the second operational amplifier OPA2 is connected to the negative input end of the second operational amplifier OPA2 via a feedback resistor Ri. Furthermore, a reference voltage vref is supplied to the negative input end of the second operational amplifier OPA2 (a connection point between the resistor Rf and the resistor Ri) via a resistor Rh.

The positive output end of the preamplifier pre-amp is connected to the positive input end of the second operational amplifier OPA2 via a resistor Rg. The reference voltage vref is supplied to the positive input end of the second operational amplifier OPA2 via a resistor Rj.

And, the output end of the second operational amplifier OPA2 becomes the output end of an output vout which is a detection signal.

Therefore, regarding a pair of inputs of the operational amplifier OPA2, the difference between the pair of inputs is amplified using the reference voltage vref as the reference according to the resistance value of the resistor Ri, and the amplified difference is outputted.

Figure 2:
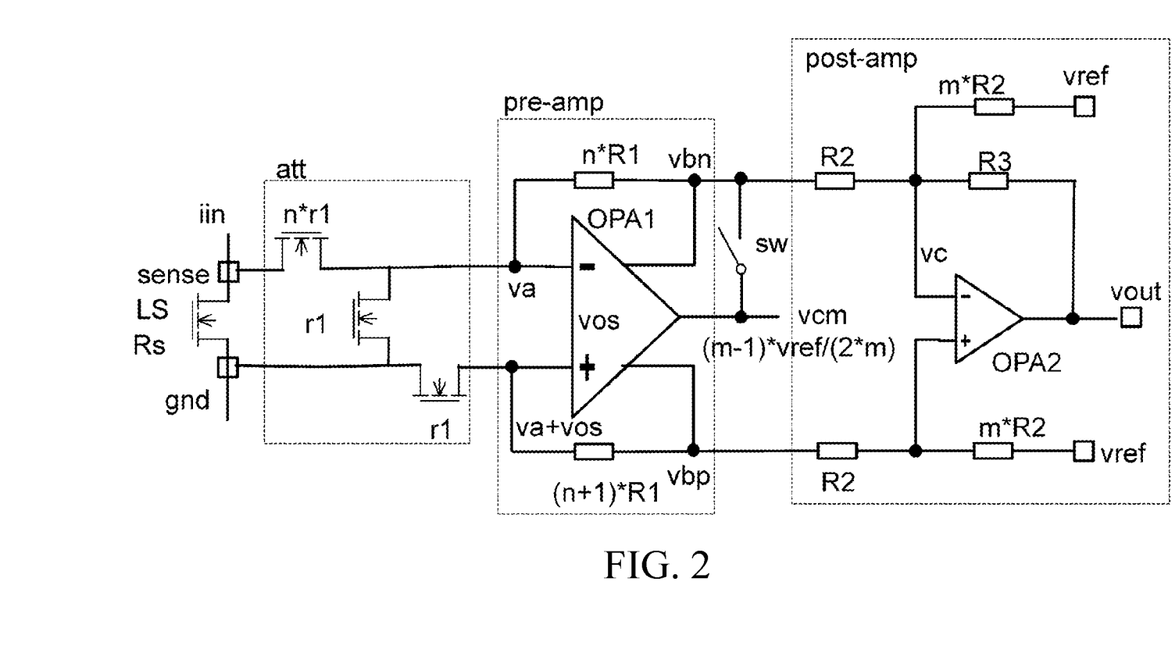
FIG. 2 is a diagram showing an example of set resistance values of respective resistors in the circuit of FIG. 1.

FIG. 2 is a diagram showing an example of set resistance values of respective resistors in the circuit of FIG. 1.

In this example, it is set that resistance $Ra=n*r1$, resistance $Rb=r1$, resistance $Rc=r1$, resistance $Rd=n*R1$, resistance $Re=(n+1)R1$, resistance $Rf=R2$, resistance $Rg=R2$, resistance $Rh=m*R2$, resistance $Ri=R3$, and resistance $Rj=m*R2$.

In this example, the coefficient "n" is the attenuation index in the attenuator att. In a case of large current measurement, a large value is used for n. In addition, the coefficient "m" defines the ratio of (vref−vout) to (vout−vcm) when iin=0 A.

In such a configuration, when the drive current iin=0 A, vbp=vbn=vcm, and if the current flowing through the feedback resistor Ri (=R3) of the operational amplifier OPA2 is set to 0 to minimize the error, the potential difference between the positive input end and the negative input end of the operational amplifier OPA2 becomes 0 V.

Therefore, $vc=vout$.

It is desirable that the drive current iin operates in a positive-negative symmetrically manner, and in a case where vout changes from 0 V to vref, it is set that vout=vref/2 when iin=0 A.

In this case, when iin=0 A, vc=vref/2.

In addition, the negative input end voltage of the operational amplifier OPA2 is $$vc = vcm*m*R2/[(1+m)R2] + vref*R2/[(m+1)R2]$$
$$= vcm*m/(m+1) + vref/(m+1)$$

Therefore, $$vcm = vc*(m+1)/m - vref/m,$$

and
by substituting vc=vref/2, $$vcm = vref*(m+1)/(2m) - vref/m$$
$$= vref*(m-1)/(2m)$$

The current iin-to-output voltage vout gain in the current sense amplifier is defined by the resistor network in the preamplifier pre-amp and the post-amplifier post-amp. Therefore, the gain of the current sense amplifier can be trimmed by adjusting the resistance values of these resistors.

Here, if the current iin flowing through the drive transistor LS is 0 A, the difference of the pair of outputs of the preamplifier pre-amp should be 0 V. However, if there is an offset voltage (vos) in the preamplifier pre-amp, even if the current iin=0, vbp−vbn does not be 0 according to the offset voltage vos.

If it is set as shown in the figure, $$vbp - vbn = (1 + (n + 1)*R1/r1)vos.$$

In this way, if the offset voltage vos is not 0, a temperature drift may occur due to the offset voltage.

That is, the cause of the temperature drift is that the feedback resistors Rd and Re (that is, R1) of the operational amplifier OPA1 and the resistors Ra, Rb, and Rc (that is, r1) of the attenuator att are uncorrelated with respect to the temperature coefficient. The reason is that the resistor R1 of the operational amplifier OPA1 is configured by a standard resistor and the resistance r1 of the attenuator att is configured by an ON resistance of a transistor (field-effect transistor (FET)). However, when the offset voltage vos=0, the change of the ratio caused by the temperatures of the resistance R1 and the resistance r1 does not affect vbp-vbn. Therefore, in the embodiment, the offset voltage vos of the preamplifier pre-amp is adjusted to 0 V.

In the current sense amplifier according to the embodiment, includes the switch sw, and when the switch sw is turned on, vbn=vcm. In addition, vcm=(vbn+vbp)/2.

Therefore, when the switch sw becomes ON and the offset voltage vos exists, both vbp and vbn shift according to half of vos.

In the embodiment, by turning on/off the switch sw, a voltage shift corresponding to the magnitude of the offset voltage vos can be detected. Therefore, the shift of the output caused by turning on/off the switch sw can be confirmed, while the offset voltage vos can be brought close to 0 by the offset adjustment function of the preamplifier pre-amp. Specifically, the adjustment is performed by trimming an input offset adjustment circuit arranged in the input stage of the operational amplifier OPA1. Such trimming can also be realized by resistances, currents, and employing transistors of different sizes.

Figure 3:
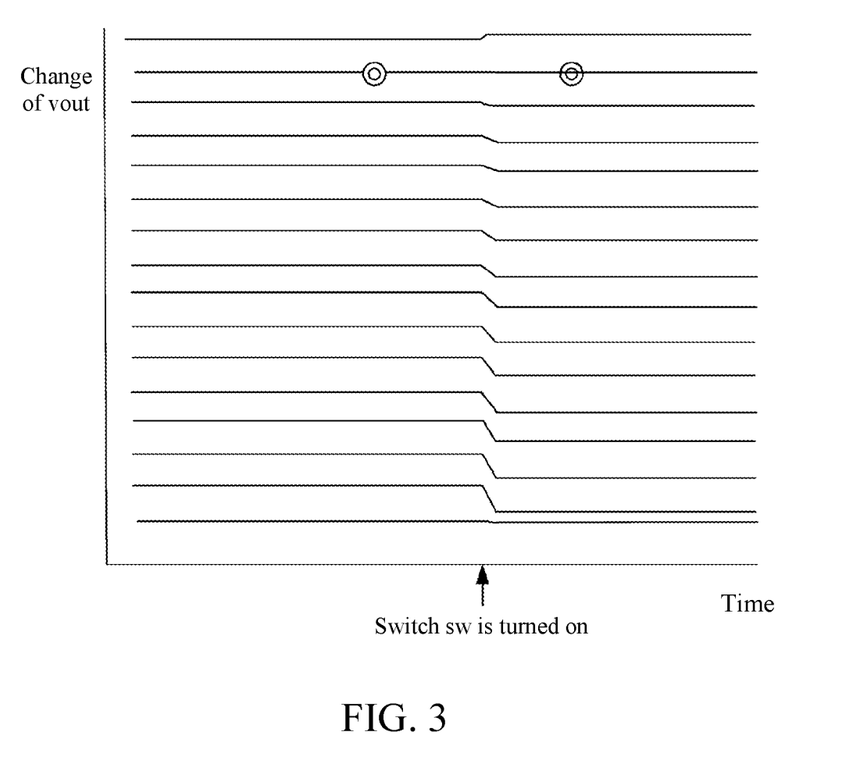
FIG. 3 is a diagram showing the change of an output vout caused by turning on a switch sw.

FIG. 3 is a diagram showing the change of the output vout caused by turning on the switch sw. The cases at respective setting values when the setting value of the offset adjustment trimming circuit of OPA1 is changed for the preamplifier pre-amp having an offset voltage are respectively represented by separate lines. In this example, in the case of the second setting from the top, the change of the output vout caused by turn-on/turn-off of the switch sw is small. Therefore, it can be seen that it is sufficient to use this setting trimming.

Moreover, various known trimming methods can be used, such as changing the bias voltage to the positive and negative input ends in the preamplifier pre-amp.

Figure 4:
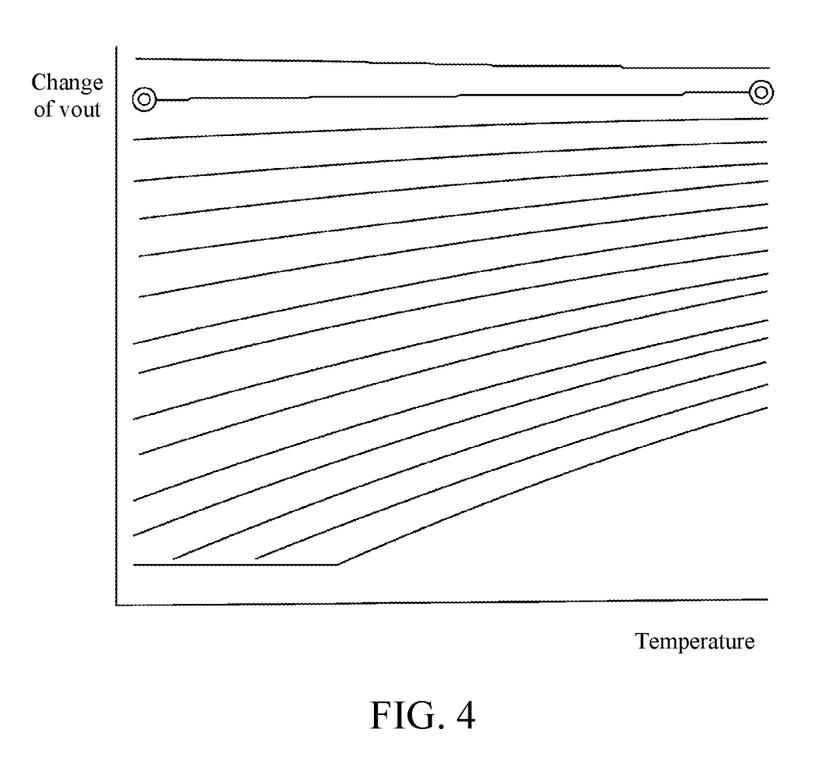
FIG. 4 is a diagram showing the temperature characteristic of vout in cases of various trimming settings.

FIG. 4 is a diagram showing the temperature characteristic of vout in cases of using the respective trimming setting values described above. It can be seen that in the case of the second setting from the top, which is considered optimal in FIG. 2, the change caused by the temperature is small, and the temperature dependence can be reduced by this setting.

Other Configuration Examples

Figure 5:
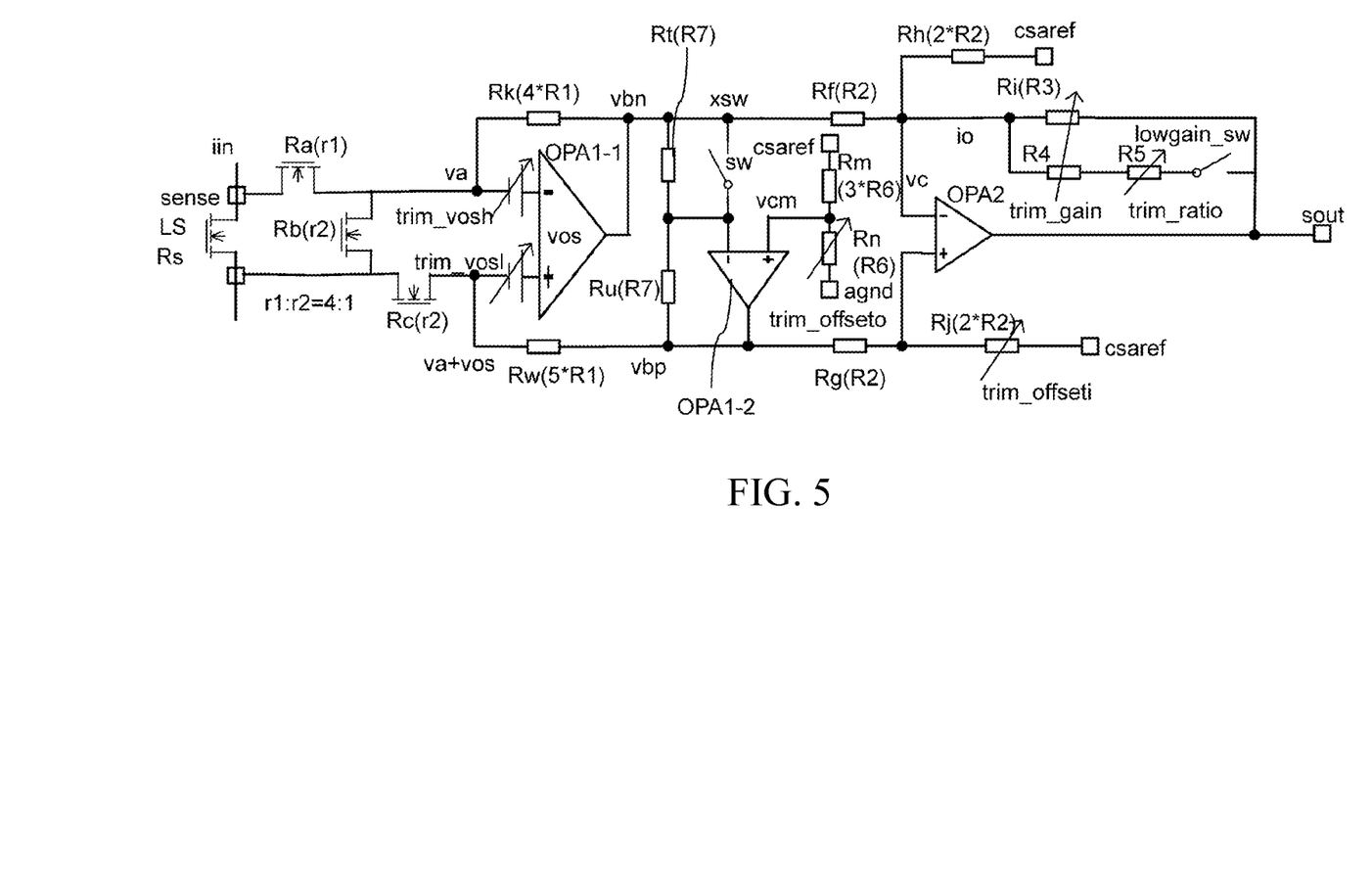
FIG. 5 is an example in which a preamplifier pre-amp is configured by two single-ended amplifiers, namely a first operational amplifier OPA1-1 and a first operational amplifier OPA1-2.

FIG. 5 is an example in which the preamplifier pre-amp is configured by two single-ended amplifiers, namely a first operational amplifier OPA1-1 and a first operational amplifier OPA1-2.

In this example, the output of the first operational amplifier OPA1-1 is connected to the negative input end via a feedback resistor Rk.

On the other hand, the positive input end of the first operational amplifier OPA1-1 is outputted directly via a resistor Rw. And, the output of the first operational amplifier OPA1-1 and the output side of the resistor Rw become a pair of outputs, and these are connected by division resistors Rt and Ru. And, a connection point between the division resistor Rt and the division resistor Ru is inputted to the negative input end of the first operational amplifier OPA1-2. The common mode voltage vcm is inputted to the positive input end of the first operational amplifier OPA1-2, and the output of the operational amplifier OPA1-2 is connected to a connection point between the resistor Rw and the division resistor Ru. Moreover, the common mode voltage vcm is obtained by voltage division of resistors Rm and Rn connected between a reference voltage csaref and a ground agnd. Here, the operational amplifier OPA1-2 is an inversion amplifier of the output of the operational amplifier OPA1-1. With the common mode voltage vcm as the reference, a positive output to vbp is performed when vbn is negative, and the operation is reversed when vbn is positive. The amplitude thereof is determined by the ratio of the resistors Rt and Ru. In this example, the resistance values of the resistors Rt and Ru are both R7, and therefore the operational amplifier OPA1-2 operates as an inversion amplifier with a gain of 1 times. And, the comparison result of the operational amplifier OPA1-2 is fed back to the positive input end of the operational amplifier OPA1-1 via Rw.

In addition, in the negative feedback path of the post-amplifier post-amp, a series connection of resistors R4 and R5 and a switch lowgain_sw is arranged in parallel with the feedback resistor Ri. By turning on the switch lowgain_sw, the resistance value of the feedback resistor can be reduced and the gain of the second operational amplifier OPA2 can be reduced.

In such a configuration, OPA1-2 always maintains the common mode voltage at vcm, and therefore it may be useful for high-speed settling.

And, in this example, it is set that resistance $Ra=r1$, resistance $Rb=r2$, resistance $Rc=r2$, $r1:r2=4:1$, resistance $Rk=4*R1$, resistance $Rw=5*R1$, resistance $Rf=R2$, resistance $Rg=R2$, resistance $Rh=2*R2$, resistance $Rj=2*R2$, resistance $Ri=R3$, resistance $Rt=R7$, resistance $Ru=R7$, resistance $Rm=3*R6$, and resistance $Ru=R6$.

<When the Switch sw is Turned Off>

If it is set that iin=0, sw=off, vcm=vcsaref/4, and r1=4*r2, the voltages of the pair of outputs of the attenuator att are set to va and va+vos, the output voltage of the first operational amplifier OPA1-1 is set to vbn, the output side voltage of the resistor Rw (the output voltage of OPA1-2) is set to vbp, and the output of the second operational amplifier OPA2 is set to sout, the voltage at each point is as follows.

$$vcm = (vbp + vbn)/2$$
$$va + vos = vbp * r2/(r2 + 5 * R1)$$
$$va = vbn * (r1//r2)/(r1//r2 + 4 * R1) = vbn * r2/(r2 + 5 * R1)$$

(note that the symbol [//] indicates a parallel connection)

$$vos = (vbp - vbn) * r2/(r2 + 5 * R1)$$
$$vbp - vbn = vos * (r2 + 5 * R1)/r2 = vos * (1 + 5 * R1/r2)$$
$$vbp + vbn = 2 * vcm$$
$$vbp = vcm + vos * (r2 + 5 * R1)/(2 * r2)$$

$sout(\text{OFF}) =$ $$csaref/3 + (2/3) * [vcm + vos * (r2 + 5 * R1)/(2 * r2)] + (vbp - vbn) * R3/R2$$

<When the Switch sw is Turned On>

$$vbn = vcm$$
$$va = vcm * r2/(r2 + 5 * R1)$$
$$va + vos = vbp * r2/(r2 + 5 * R1)$$
$$vcm * r2/(r2 + 5 * R1) + vos = vbp * r2/(r2 + 5 * R1)$$
$$vbp = vcm + vos * (r2 + 5 * R1)/r2$$
$$vbp - vbn = vos * (r2 + 5 * R1)/r2$$
$$vbp + vbn = 2 * vcm + vos * (r2 + 5 * R1)/r2$$
$$vbp = vcm + vos * (r2 + 5 * R1)/r2$$

$sout(\text{ON}) =$ $$csaref/3 + (2/3) * [vcm + vos * (r2 + 5 * R1)/r2] + (vbp - vbn) * R3/R2$$

<Difference Caused by Turn-on/Turn-Off of Switch sw>

$\Delta sout = sout(\text{ON}) - sout(\text{OFF}) =$ $$(2/3) * vos * (r2 + 5 * R1)/(2 * R2) = vos * (r2 + 5 * R1)/(3 * R2)$$

In this way, the difference Δsout between sout when the switch sw is ON and sout when the switch is OFF is proportional to vos.

Specific Numerical Example

An example of a specific setting value in an actual application is shown below.

The ON resistance Rs of the drive transistor LS can take a value of about 8 mΩ and the ratio sout/iin of the output voltage sout to the current iin of the current sense amplifier can take a value of about 1.5 V/30 A.

In this case, the total current-to-voltage gain Total_gain=1.5 V/(8 mohm*30 A)=6.25, the current ir2 of the resistor Rb=169 uA, the amplification rate R3/R2 of the post-amplifier post-amp=4.5, the output difference vbp-vbn of the preamplifier pre-amp=660 mV, the resistance reference value R1 of the feedback resistor of the preamplifier=390 ohm, and the resistance value r2 of the resistors Rb and Rc of the attenuator att=700 ohm.

<Trimming>

In the configuration of FIG. 5, a variable power supply is arranged in front of the positive and negative input ends of the operational amplifier OPA1-1. This is a configuration in which the bias voltage is adjusted by resistance trimming. By such trimming, the offset voltage vos of the preamplifier pre-amp can be adjusted.

In addition, with regard to the resistor Rn for determining the common mode voltage vcm of the operational amplifier OPA1-2 and the resistor Rj of the connection path of the reference voltage vref, all of which serve as variable resistances that can be trimmed. Thereby, it is possible to adjust an offset generated in the operational amplifier OPA1-2, the operational amplifier OPA2, or the like other than in the operational amplifier OPA1-1, and an offset generated in the output sout due to an error in the resistance ratio of the resistors Rf, Rh, Rg, and Rj.

In addition, by trimming the resistances Ri, R4, and R5 of the post-amplifier post-amp, the gain of trimming and the like can be changed.

"Other Configurations"

The output stage of the preamplifier pre-amp can be realized by an N-metal-oxide-semiconductor (NMOS) source follower, and the in-phase voltage of the output of the preamplifier pre-amp can be brought close to the GND level, so that a relatively large current can be made to flow through the block of the attenuator att.

Because the output of the post-amplifier post-amp is adjusted in the middle of the reference voltage vref, each input terminal of the operational amplifier inside the post-amplifier post-amp may be connected to the reference voltage vref via a resistor.

Because the common mode voltage vcm of the output of the preamplifier pre-amp is proportional to the reference voltage vref, the output voltage of the post-amplifier post-amp becomes proportional to the reference voltage.

When the switch sw is turned on, the output voltage of the post-amplifier post-amp shifts in proportion to the offset voltage of the input stage of the preamplifier pre-amp, so that measurement can be performed for trimming without touching sensitive nodes.

DESCRIPTION OF THE REFERENCE NUMERALS

LS: drive transistor
sw: switch
OPA: operational amplifier
R, r: resistor

What is claimed is:

1. A current sense amplifier, which measures a voltage drop in a drive transistor to measure a current flowing through the drive transistor, the current sense amplifier comprising:
    a preamplifier, to which a voltage across the drive transistor is inputted, and which obtains a positive output and a negative output corresponding to a voltage difference of the inputted voltage across the drive transistor;
    a post-amplifier, to which the positive output and the negative output of the preamplifier are inputted, and which obtains an output corresponding to a difference of the positive output and the negative output of the preamplifier; and
    a switch, which connects an input end of a common mode voltage and the negative output, the common mode voltage serving as the operation reference of the preamplifier; wherein a change of the positive output caused by turning on/off the switch is able to be detected as a change of the output of the post-amplifier.

2. The current sense amplifier according to claim 1, wherein
    an attenuator using a transistor having the same characteristic as the drive transistor is arranged in the front stage of the preamplifier.

3. The current sense amplifier according to claim 1, wherein
    the post-amplifier is supplied with a reference voltage serving as an operation reference of the post-amplifier, and sets, by a combination of resistances placed between the input end of the reference voltage and the input end of the common mode voltage, a relationship between the reference voltage and the output of the post-amplifier in a case where the current flowing through the drive transistor is 0.

4. The current sense amplifier according to claim 3, wherein
    the output of the post-amplifier is set to ½ of the reference voltage.

* * * * *